(12) United States Patent
Myong

(10) Patent No.: US 8,669,465 B2
(45) Date of Patent: Mar. 11, 2014

(54) PHOTOVOLTAIC DEVICE AND METHOD FOR MANUFACTURING THE SAME

(75) Inventor: Seung-Yeop Myong, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 543 days.

(21) Appl. No.: 12/879,212

(22) Filed: Sep. 10, 2010

(65) Prior Publication Data

US 2011/0061725 A1    Mar. 17, 2011

(30) Foreign Application Priority Data

Sep. 11, 2009  (KR) .................. 10-2009-0086030

(51) Int. Cl.
*H01L 31/00* (2006.01)
(52) U.S. Cl.
USPC .................. 136/255; 136/249; 136/246
(58) Field of Classification Search
CPC ................................ H01L 31/02327
USPC ................................ 136/255, 249
See application file for complete search history.

(56) References Cited

U.S. PATENT DOCUMENTS

2009/0020154 A1 * 1/2009 Sheng et al. .................. 136/255
2009/0293936 A1 * 12/2009 Myong .......................... 136/246

FOREIGN PATENT DOCUMENTS

KR    1020080049000    * 12/2008    ............ H01L 31/042

OTHER PUBLICATIONS

Sarker, "The Growth of Crystallinity in Undoped SiO:H Films at Low RF-Power Denisty and Substrate Temperature", Jpn. J. Appl. Physics, vol. 40, Feb. 2001, pp. L94-L96.*
Chung, "The Properties of n-μC-SiO:H interlayers for thin-film silicon tandem solar cells", Photovoltaic Specialists Conference, 2009 34th IEEE, Jun. 2009, pp. 759-762.*

* cited by examiner

*Primary Examiner* — Devina Pillay
(74) *Attorney, Agent, or Firm* — H.C. Park & Associates, PLC

(57) ABSTRACT

Disclosed is a method for manufacturing a photovoltaic device. The method comprising: forming a first electrode on a substrate; forming a first unit cell comprising an intrinsic semiconductor layer on the first electrode; forming an intermediate reflector on the first unit cell, and the intermediate reflector comprising a plurality of sub-layers stacked alternately by changing a flow rate of non-silicon based source gas; forming a second unit cell comprising an intrinsic semiconductor layer on the intermediate reflector; and forming a second electrode on the second unit cell.

22 Claims, 10 Drawing Sheets

PHOTOVOLTAIC DEVICE AND METHOD FOR MANUFACTURING THE SAME

CROSS REFERENCE TO RELATED PATENT APPLICATION

The present application claims priority under 35 U.S.C. §119 to Korean Patent Application Serial Number 10-2009-0086030, filed on Sep. 11, 2009, the entirety of which is hereby incorporated by reference.

FIELD OF THE INVENTION

This embodiment relates to a photovoltaic device and a method for manufacturing the same.

BACKGROUND OF THE INVENTION

Recently, because of high oil prices and the global warming phenomenon based on a large amount of $CO_2$ emissions energy is becoming the most important issue in determining the future life of mankind. Even though many technologies using renewable energy sources including wind force, biofuels, hydrogen/fuel cells and the like have been developed, a photovoltaic device using sunlight is in the spotlight. This is because solar energy, the origin of all energies, is an almost infinite clean energy source.

The sunlight incident on the surface of the earth has an electric power of 120,000 TW. Thus, theoretically, a photovoltaic device having a photoelectric conversion efficiency of 10% and covering only 0.16% of the land surface of the earth is capable of generating 20 TW of electric power, which is twice as much as the amount of energy globally consumed during one year.

Practically, the world photovoltaic market has grown by almost a 40% annual growth rate for the last ten years. Now, a bulk-type silicon photovoltaic device occupies 90% of the photovoltaic device market share. The bulk-type silicon photovoltaic device includes a single-crystalline silicon photovoltaic device and a multi-crystalline or a poly-crystalline silicon photovoltaic device and the like. However, productivity of a solar-grade silicon wafer which is the main material of the photovoltaic device is not able to fill the explosive demand thereof, so the solar-grade silicon wafer is globally in short supply. Therefore, this shortage of the solar-grade silicon wafer is a huge threatening factor in reducing the manufacturing cost of a photovoltaic device.

Contrary to this, a thin-film silicon photovoltaic device including a light absorbing layer based on a hydrogenated amorphous silicon (a-Si:H) allows a reduction of thickness of a silicon layer equal to or less than 1/100 as large as that of a silicon wafer of the bulk-type silicon photovoltaic device. Also, it makes possible to manufacture a large area photovoltaic device at a lower cost.

Meanwhile, a single-junction thin-film silicon photovoltaic device is limited in its achievable performance. Accordingly, a double junction thin-film silicon photovoltaic device or a triple junction thin-film silicon photovoltaic device having a plurality of stacked unit cells has been developed, pursuing high stabilized efficiency.

The double junction or the triple junction thin-film silicon photovoltaic device is referred to as a tandem-type photovoltaic device. The open circuit voltage of the tandem-type photovoltaic device corresponds to a sum of each unit cell's open circuit voltage. Short circuit current is determined by a minimum value among the short circuit currents of the unit cells.

Regarding the tandem-type photovoltaic device, research is being devoted to an intermediate reflector which is capable of improving efficiency by enhancing internal light reflection between the unit cells.

SUMMARY OF THE INVENTION

One aspect of this invention is a method for manufacturing a photovoltaic device. The method comprising: forming a first electrode on a substrate; forming a first unit cell comprising an intrinsic semiconductor layer on the first electrode; forming an intermediate reflector on the first unit cell, and the intermediate reflector comprising a plurality of sub-layers stacked alternately by changing a flow rate of non-silicon based source gas; forming a second unit cell comprising an intrinsic semiconductor layer on the intermediate reflector; and forming a second electrode on the second unit cell.

Further another aspect of this invention is a photovoltaic device. The photovoltaic device comprising: a substrate; a first electrode placed on the substrate; a first unit cell placed on the first electrode and comprising an intrinsic semiconductor layer; an intermediate reflector placed on the first unit cell and comprising a plurality of sub-layers stacked alternately and the plurality of sub-layers having different crystal volume fractions from each other; a second unit cell placed on the intermediate reflector and comprising an intrinsic semiconductor layer; and a second electrode being placed on the second unit cell.

DETAILED DESCRIPTION OF THE INVENTION

A method for manufacturing a photovoltaic device according to an embodiment of the present invention will be described in detail with reference to the drawings. FIGS. 1a to 1h show a method for manufacturing a photovoltaic device according to an embodiment of the present invention.

Figure 1A:
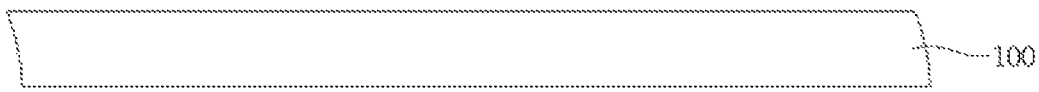
FIGS. 1a to 1h show a method for manufacturing a photovoltaic device according to an embodiment of the present invention.

As shown in FIG. 1a, a substrate 100 is provided. The substrate 100 may include an insulating transparent substrate or insulating opaque substrate. The insulating transparent substrate may be included in a p-i-n type photovoltaic device. The insulating opaque substrate may be included in an n-i-p type photovoltaic device. The p-i-n type photovoltaic device and n-i-p type photovoltaic device will be described later in detail.

Figure 1B:
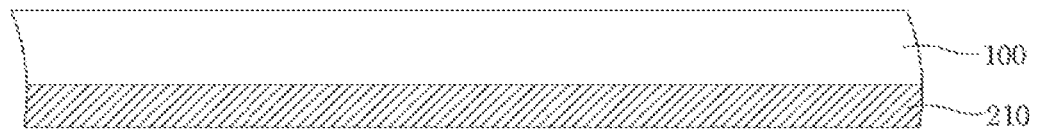

As shown in FIG. 1b, a first electrode 210 is formed on the substrate 100. In the embodiment of the present invention, the first electrode 210 may be formed by a chemical vapor deposition (CVD) method and comprises a transparent conductive oxide (TCO) such as Tin Dioxide ($SnO_2$) or Zinc Oxide (ZnO).

Figure 1C:
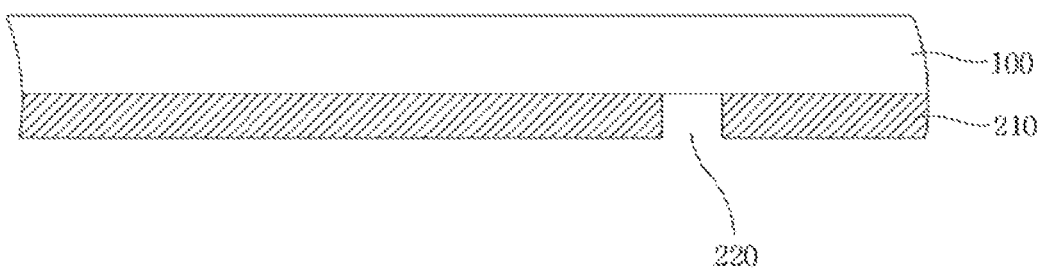

As shown in FIG. 1c, a laser beam is irradiated onto the first electrode 210 or substrate 100 so that the first electrode 210 is scribed. As a result, a first separation groove 220 is hereby formed in the first electrode 210. That is, since the first separation groove 220 penetrates through the first electrode 210, the first electrodes 210 adjacent thereto are prevented from being short-circuited therebetween.

Figure 1D:
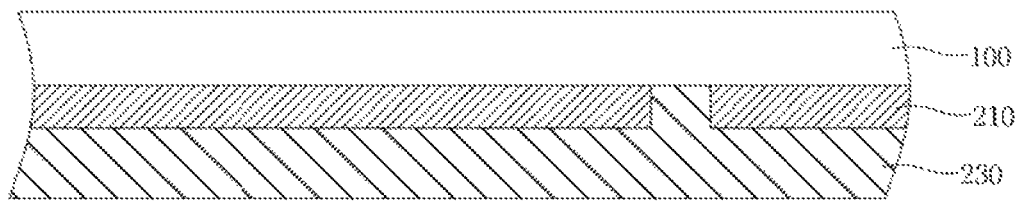

As shown in FIG. 1d, a first unit cell 230 is formed on the first electrode 210 by using a CVD method. Here, the first unit cell 230 includes a p-type semiconductor layer, intrinsic semiconductor layer, and n-type semiconductor layer. After source gas including silicon, such as $SiH_4$, and another source gas including group 3 elements, such as $B_2H_6$, are injected together into a reaction chamber in order to form the p-type semiconductor layer, the p-type semiconductor layer is formed by using a CVD method. After that, the intrinsic semiconductor layer is formed on the p-type semiconductor layer by using CVD method after source gas including silicon is injected into the reaction chamber. Reaction gas including group 5 elements, such as $PH_3$, and source gas including silicon are injected together, and then the n-type semiconductor layer is formed on the intrinsic semiconductor layer by using the CVD method. As a result, the p-type semiconductor layer, intrinsic semiconductor layer, and n-type semiconductor layer are sequentially stacked on the first electrode 210.

Figure 1E:
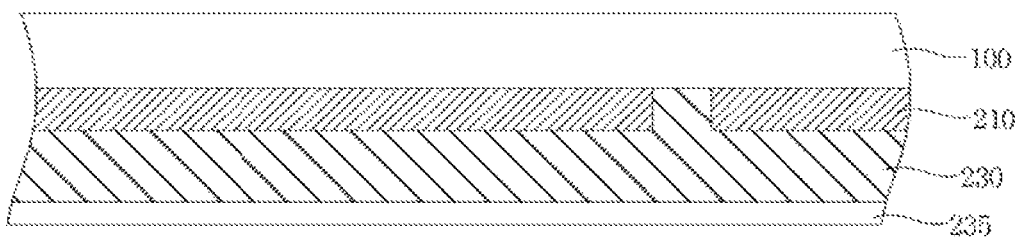

As shown in FIG. 1e, an intermediate reflector 235 is formed on the n-type semiconductor layer of the first unit cell 230 through a plasma-enhanced chemical vapor deposition method. The flow rate of non-silicon based source gas, such as oxygen source gas, carbon source gas, or nitrogen source gas, introduced into the reaction chamber so as to form the intermediate reflector 235 alternately changes between a first flow rate value and second flow rate value. As a result, the intermediate reflector 235 according to the embodiment of the present invention has a multilayer structure and includes a hydrogenated n-type nano-crystalline silicon oxide (n-nc-SiO:H), hydrogenated n-type nano-crystalline silicon carbide (n-nc-SiC:H), or hydrogenated n-type nano-crystalline silicon nitride (n-nc-SiN:H). The intermediate reflector 235 will be described later in detail.

Figure 1F:
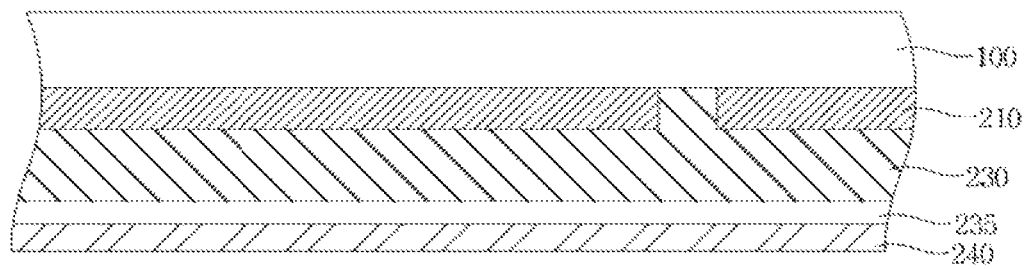

As shown in FIG. 1f, a second unit cell 240 including a p-type semiconductor layer, intrinsic semiconductor layer, and n-type semiconductor layer is formed on the intermediate reflector 235.

Figure 1G:
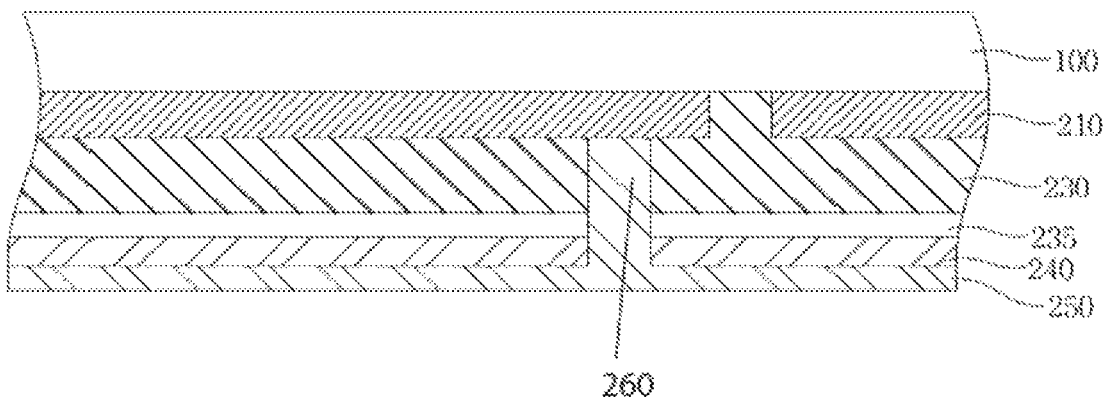

As shown in FIG. 1g, a second separation groove 260 penetrating the first unit cell 230, intermediate reflector 235, and second unit cell 240 is formed, and then a second electrode 250 is formed on the second unit cell 240 so that the second separation groove 260 is filled.

Figure 1H:
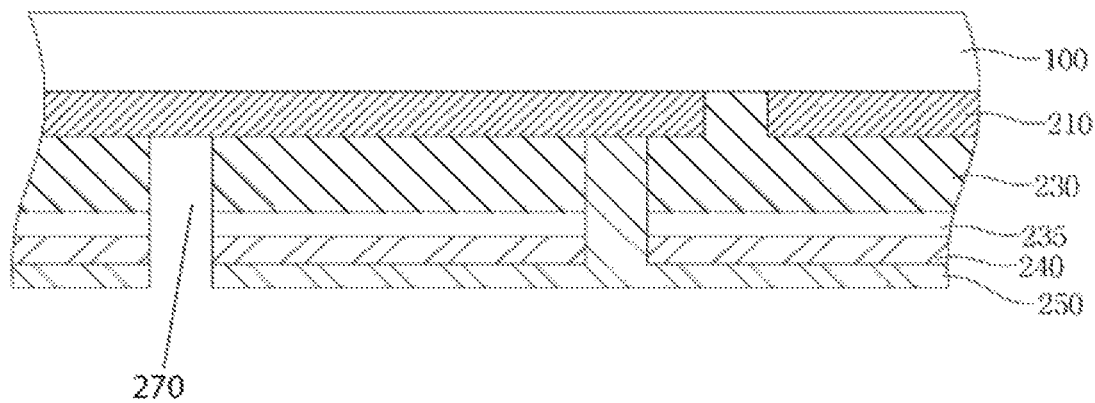

As shown in FIG. 1h, a third separation groove 270 penetrating the first unit cell 230, intermediate reflector 235, second unit cell 240, and second electrode 250 is formed. A protection layer (not shown) may be formed on the second electrode 250 so that the third separation groove 270 is filled.

The embodiment of the present invention shown in FIGS. 1a to 1h can be a double junction photovoltaic device composed of two unit cells or a triple junction photovoltaic device composed of three unit cells.

Figure 2:
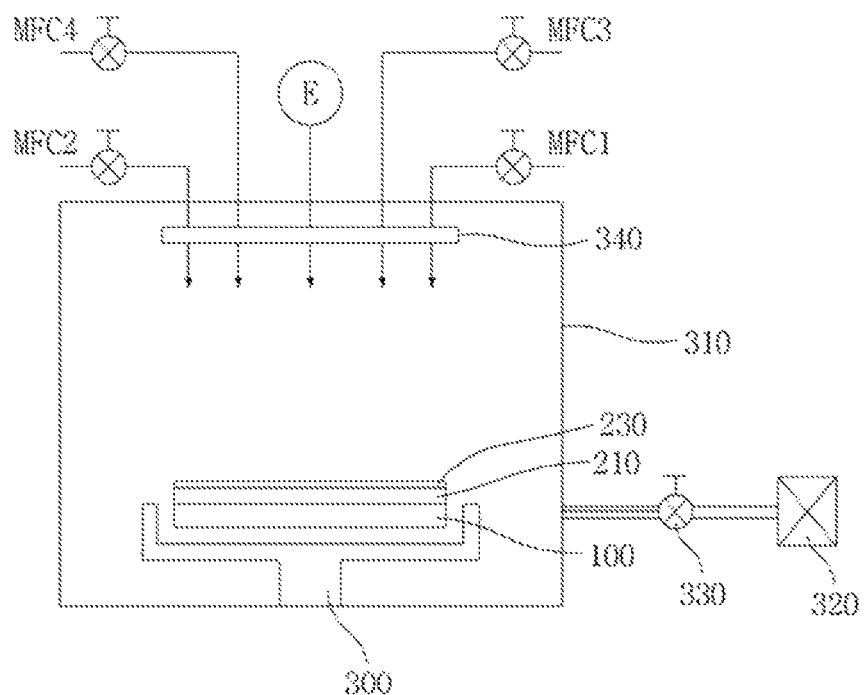
FIG. 2 shows a plasma-enhanced chemical vapor deposition device for forming an intermediate reflector in accordance with the embodiment of the present invention.

Next, a method for forming the intermediate reflector 235 will be described in detail with reference to the drawings. FIG. 2 shows a plasma-enhanced chemical vapor deposition apparatus for forming the intermediate reflector according to an embodiment of the present invention. As shown in FIG. 2, the substrate 100 on which the first electrode 210 and first unit cell 230 are formed is placed on a plate 300 functioning as an electrode. The first unit cell 230 may include sequentially stacked a p-type semiconductor layer, intrinsic semiconductor layer, and n-type semiconductor layer.

Here, the n-type semiconductor layer may include a hydrogenated n-type nano-crystalline silicon (n-nc-Si:H), and the source gas for forming the n-type nano-crystalline silicon may include silane ($SiH_4$), hydrogen ($H_2$), or phosphine ($PH_3$).

After the n-type semiconductor layer including a hydrogenated n-type nano-crystalline silicon is formed, the non-silicon based source gas, such as oxygen source gas, carbon source gas, or nitrogen source gas, is introduced into the reaction chamber in a state where the flow rate, substrate temperature, and process pressure of the source gas introduced into the reaction chamber 310 are maintained.

Since the non-silicon based source gas is introduced into the reaction chamber 310 by keeping the flow rate, substrate temperature, and process pressure of the source gas in the reaction chamber 310, the n-type semiconductor layer of the first unit cell 230 and the intermediate reflector 235 can be formed in the same reaction chamber 310. Forming the n-type semiconductor layer and intermediate reflector 235 in the same reaction chamber 310 can be applied not only to the p-i-n type photovoltaic device according to the embodiment of the present invention but also to the n-i-p type photovoltaic device described later.

As shown in FIG. 2, the source gases such as hydrogen ($H_2$), silane ($SiH_4$), and phosphine ($PH_3$) are introduced into the reaction chamber 310 through mass flow controllers MFC1, MFC2, and MFC3 and an electrode 340 having nozzles formed therein. The non-silicon based source gas is introduced into the reaction chamber 310 through the mass flow controller (MFC4) and nozzle of the electrode 340. When the non-silicon based source gas is oxygen source gas, the oxygen source gas may include oxygen or carbon dioxide. When the non-silicon based source gas is carbon source gas, the carbon source gas may include $CH_4$, $C_2H_4$, or $C_2H_2$. When the non-silicon based source gas is nitrogen source gas, the nitrogen source gas may include $NH_4$, $N_2O$, or NO.

Here, an angle valve 330 is controlled to maintain the pressure of the reaction chamber 310 and keep it constant. When the pressure of the reaction chamber 310 is maintained constant, production of the silicon powder due to turbulence generation in the reaction chamber 310 is prevented and the deposition condition is maintained constant. The hydrogen is introduced in order to dilute the silane, and reduces the Staebler-Wronski effect.

When the non-silicon based source gas is introduced with the source gases and a power source E provides voltage, an electrical potential difference between the electrode 340 and plate 300 makes the gases in the reaction chamber 310 change into a plasma state and then be deposited on the hydrogenated n-type nano-crystalline silicon of the first unit cell 230. As a result, an intermediate reflector is formed.

When oxygen source gas is introduced, the intermediate reflector includes a hydrogenated n-type nano-crystalline silicon oxide (n-nc-SiO:H). When carbon source gas is introduced, the intermediate reflector includes a hydrogenated n-type nano-crystalline silicon carbide (n-nc-SiC:H). When nitrogen source gas is introduced, the intermediate reflector includes a hydrogenated n-type nano-crystalline silicon nitride (n-nc-SiN:H).

Since the intermediate reflector 235 includes the hydrogenated n-type nano-crystalline silicon based material similar to the hydrogenated n-type nano-crystalline silicon of a unit cell closest to the light incident side, the intermediate reflector 235 may be easily joined with the unit cell which is closest to the light incident side.

In the embodiment of the present invention, the non-silicon based source gas such as oxygen source gas, carbon source gas and nitrogen source gas may be introduced into the reaction chamber 310 according to the flow rate change shown in FIGS. 3 to 6.

Figure 3:
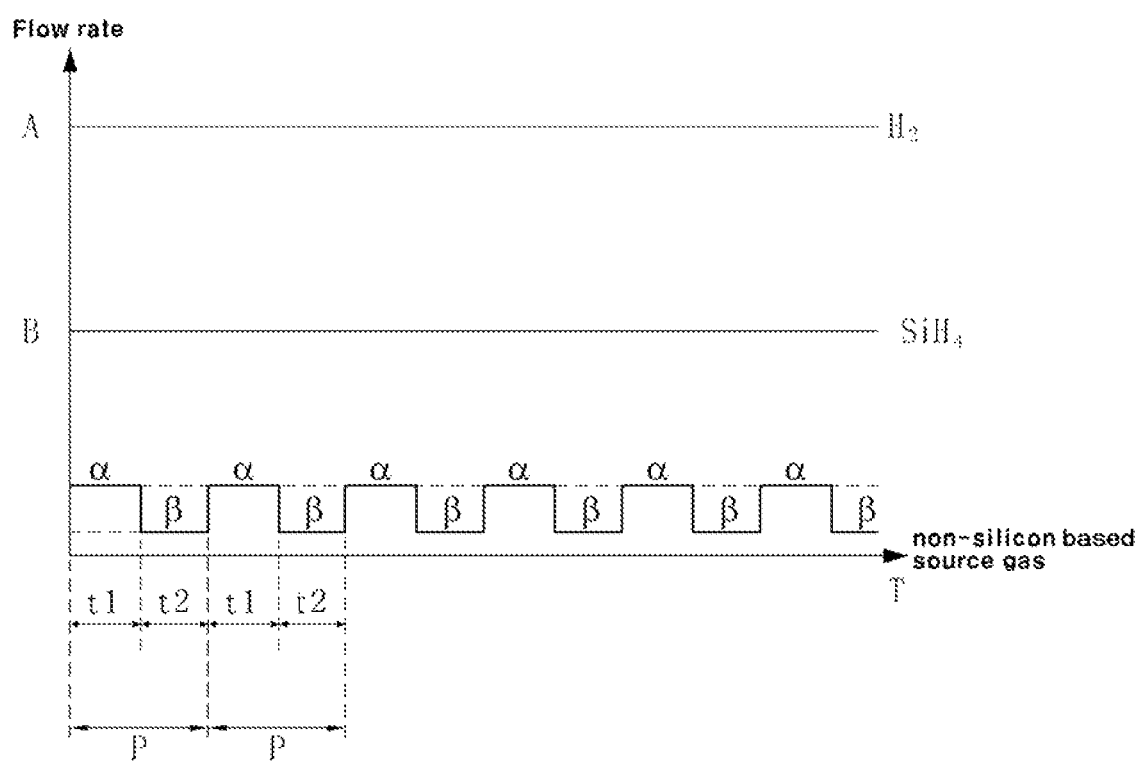
FIGS. 3 to 6 show flow rate change of oxygen source gas, carbon source gas, and nitrogen source gas for forming an intermediate reflector in accordance with the embodiment of the present invention.

As shown in FIG. 3, a flow rate A of hydrogen and a flow rate B of silane remain constant in accordance with the elapsed deposition time T, and a flow rate of non-silicon based source gas alternately varies between a first flow rate value $\alpha$ and second flow rate value $\beta$ in accordance with the elapsed deposition time T. The first flow rate value $\alpha$ and second flow rate value $\beta$ may remain constant in accordance with the elapsed deposition time T. Here, during one cycle P derived from a sum of a duration time t1 of the first flow rate value $\alpha$ and a duration time t2 of the second flow rate value $\beta$, a duration time t1 of the first flow rate value $\alpha$ and a duration time t2 of the second flow rate value $\beta$ are constant in accordance with the elapsed deposition time.

Figure 4:
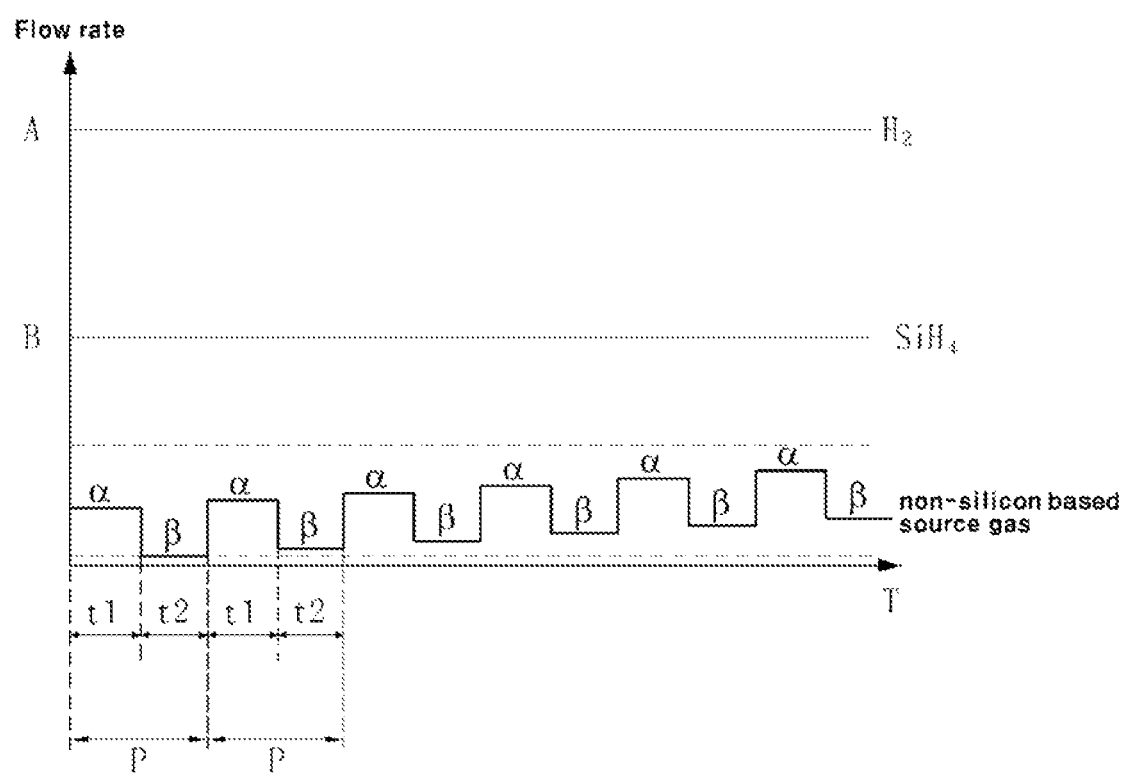

In the embodiment of the present invention, the flow rate of the non-silicon based source gas may be changed as shown in the FIG. 4. Similar to the flow rate change of FIG. 3, the flow rate A of hydrogen and the flow rate B of silane remain constant in accordance with the elapsed deposition time T, and the flow rate of the non-silicon based source gas alternately changes between the first flow rate value $\alpha$ and second flow rate value $\beta$ in accordance with the elapsed deposition time T. The first flow rate value $\alpha$ and second flow rate value $\beta$ gradually increases in accordance with the elapsed deposition time T. Here, during one cycle P derived from a sum of a duration time t1 of the first flow rate value $\alpha$ and a duration time t2 of the second flow rate value $\beta$, a duration time t1 of the first flow rate value $\alpha$ and a duration time t2 of the second flow rate value $\beta$ are constant in accordance with the elapsed deposition time.

Figure 5:
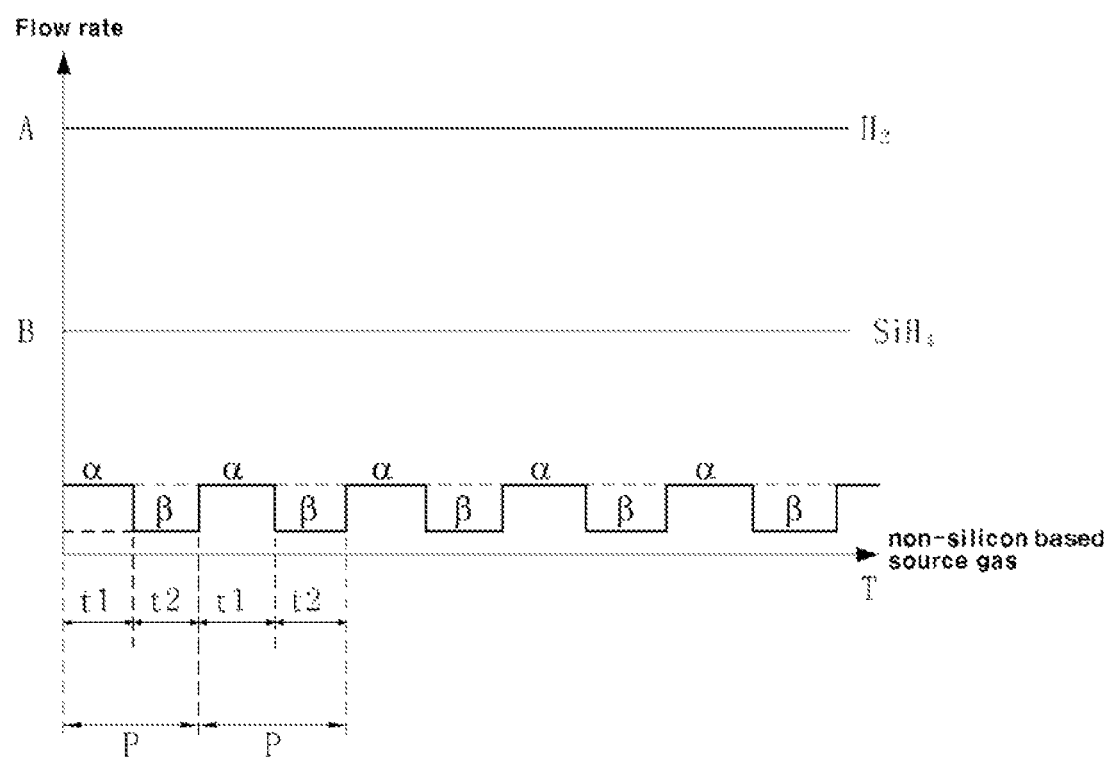

The flow rate of the non-silicon based source gas may be changed as shown in FIG. 5. The flow rate A of hydrogen and the flow rate B of silane remain constant in accordance with the elapse of the deposition time T. The flow rate of the non-silicon based source gas alternately varies between the first flow rate value $\alpha$ and second flow rate value $\beta$ in accordance with the elapse of the deposition time T. Here, the first flow rate value $\alpha$ and second flow rate value $\beta$ remain constant in accordance with the elapsed deposition time T. During one cycle P derived from a sum of a duration time t1 of the first flow rate value $\alpha$ and a duration time t2 of the second flow rate value $\beta$, a duration time t1 of the first flow rate value $\alpha$ and a duration time t2 of the second flow rate value $\beta$ gradually increase in accordance with the elapsed deposition time T.

Figure 6:
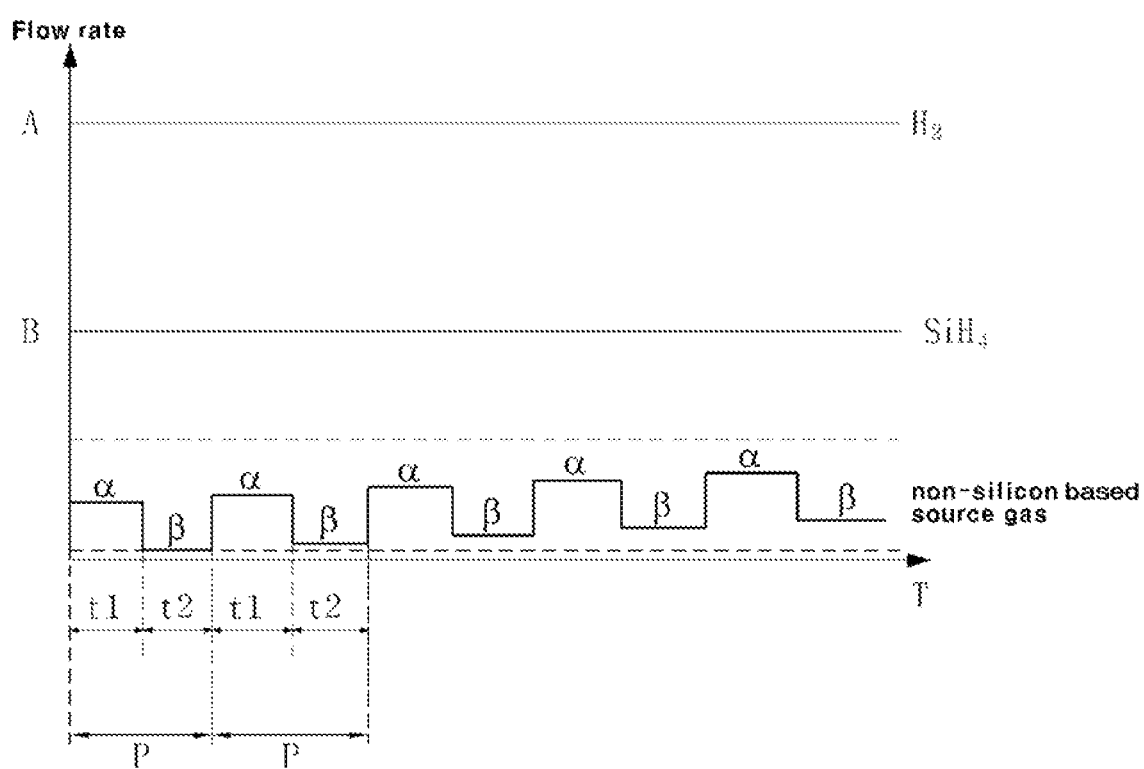

The flow rate of the non-silicon based source gas may be changed as shown in FIG. 6. The flow rate A of hydrogen and the flow rate B of silane remain constant in accordance with the elapsed deposition time T. The flow rate of the non-silicon based source gas alternately varies between the first flow rate value $\alpha$ and second flow rate value $\beta$ in accordance with the elapsed deposition time T. Here, the first flow rate value $\alpha$ and second flow rate value $\beta$ gradually increase in accordance with the elapse of the deposition time T. During one cycle P derived from a sum of a duration time t1 of the first flow rate value $\alpha$ and a duration time t2 of the second flow rate value $\beta$, a duration time t1 of the first flow rate value $\alpha$ and a duration time t2 of the second flow rate value $\beta$ gradually increase in accordance with the elapsed deposition time T.

In the flow rate change of the FIGS. 3 to 6, the second flow rate value $\beta$ may be greater than or equal to zero. When the second flow rate value $\beta$ is equal to zero, the hydrogenated n-type nano-crystalline silicon (n-nc-Si:H) may be formed during the duration time t2 of the second flow rate value $\beta$.

Although the flow rate change of phosphine ($PH_3$) is not shown in FIGS. 3 to 6, the flow rate of phosphine ($PH_3$) remains constant in accordance with the elapsed deposition time T in the embodiment of the present invention. Therefore, as described through FIGS. 3 to 6, the flow rate A of hydrogen, the flow rate B of silane, and the flow rate of phosphine are constant in accordance with the elapsed deposition time T.

Figure 7:
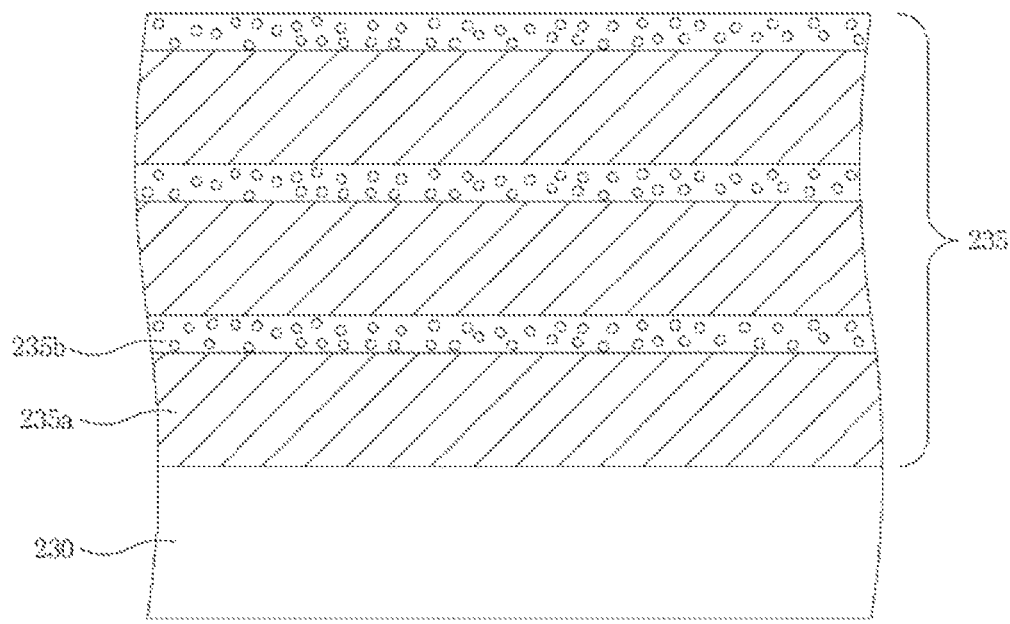
FIG. 7 shows the intermediate reflector included in the embodiment of the present invention.

Further, in the case that the flow rate of the non-silicon based source gas, such as oxygen source gas, carbon source gas, or nitrogen source gas changes, an intermediate reflector 235 including a plurality of sub-layers 235a and 235b is formed on the n-type semiconductor layer of the first unit cell 230 as shown in FIG. 7. Here, since the ratio of the duration time t1 of the first flow rate value $\alpha$ to the duration time t2 of the second flow rate value $\beta$ is constant in every cycle, as shown in FIG. 7, the intermediate reflector 235 includes at least one pair of a first sub-layer and second sub-layer having a constant thickness ratio therebetween. As such, since the flow rate A of hydrogen and the flow rate B of silane remain constant in accordance with the elapsed deposition time T, the hydrogen dilution ratio, i.e., a ratio of the flow rate of hydrogen to the flow rate of silane is constant.

The sub-layers 235a and 235b of the intermediate reflector 235 is composed of a hydrogenated nano-crystalline silicon based sub-layer 235b including crystalline silicon grains and a hydrogenated nano-crystalline silicon based sub-layer 235a.

The hydrogenated n-type nano-crystalline silicon based material included in the plurality of sub-layers 235a and 235b is produced during a phase transition from an amorphous silicon based material to a crystalline silicon based material. Hereinafter, the hydrogenated n-type nano-crystalline silicon based sub-layer is referred to as the first sub-layer 235a, and the hydrogenated n-type nano-crystalline silicon based sub-layer including crystalline silicon grains is referred to as the second sub-layer 235b.

While the crystallinity and deposition rate decrease as the flow rate of the non-silicon based source gas increases, the crystallinity and deposition rate increase as the flow rate of the non-silicon based source gas decreases. As a result, as shown in FIGS. 3 to 6, the first sub-layer 235a, i.e., the hydrogenated n-type nano-crystalline silicon based sub-layer is formed during the duration time t1 of the flow rate a of the non-silicon based source gas, and the second sub-layer 235b, i.e., hydrogenated n-type nano-crystalline silicon based sub-layer including the crystalline silicon grains is formed during the duration time t2 of the flow rate $\beta$ of the non-silicon based source gas.

The crystalline silicon grains of the second sub-layer 235b change a crystal volume fraction of the second sub-layer 235b, and the non-silicon based source gas changes a refractive index thereof. That is, the crystal volume fraction and refractive index of the first sub-layer 235a formed during the period of supplying the non-silicon based source gas with the first flow rate $\alpha$ are less than the crystal volume fraction and refractive index of the second sub-layer 235b formed during the period of supplying the non-silicon based source gas with the second flow rate $\beta$ which is less than the first flow rate $\alpha$. The crystal volume fraction is a ratio of a volume occupied by crystal to the unit volume. As a result, when the non-silicon based source gas such as oxygen source gas is supplied, the first sub-layer 235a and second sub-layer 235b include a hydrogenated n-type nano-crystalline silicon oxide (n-nc- SiC:H), and the second sub-layer 235b includes crystalline silicon grains surrounded by a hydrogenated n-type nano-crystalline silicon oxide.

When the non-silicon based source gas such as carbon source gas is supplied, the first sub-layer 235a and second sub-layer 235b include a hydrogenated n-type nano-crystalline silicon carbide (n-nc-SiC:H), and the second sub-layer 235b includes crystalline silicon grains surrounded by a hydrogenated n-type nano-crystalline silicon carbide.

When the non-silicon based source gas such as nitrogen source gas is supplied, the first sub-layer 235a and second sub-layer 235b include a hydrogenated n-type nano-crystalline silicon nitride (n-nc-SN:H), and the second sub-layer 235b includes crystalline silicon grains surrounded by a hydrogenated n-type nano-crystalline silicon nitride.

As shown in FIGS. 3 to 6, when the source gas including a non-silicon based element is not supplied during the duration time t2, that is, in the case that the second flow rate β is zero, the second sub-layer 235b may include crystalline silicon grains surrounded by a hydrogenated nano-crystalline silicon (n-nc-Si:H).

As such, since the sub-layers 235a and 235b having the mutually different crystal volume fractions or the mutually different refractive indexes are alternatively stacked and each sub-layer 235a and 235b functions as a waveguide, it is possible to maximize the reflection of light by the intermediate reflector 235. Here, since the second sub-layer 235b has a large crystal volume fraction, it improves the vertical conductivity. So it helps the current flow between the first unit cell 230 and second unit cell 240. Since the first sub-layer 235b having a refractive index lower than that of the second sub-layer 235b matches the refractive index with the unit cell closest to the light incident side, the first sub-layer 235a increases the reflection of light with a short wavelength which has high energy density, for example, light with a wavelength from 500 nm to 700 nm.

The diameter of the crystalline silicon grains of the second sub-layer 235b may be greater than or equal to 3 nm and less than or equal to 10 nm. Forming of the crystalline silicon grains having a diameter less than 3 nm decreases the vertical electrical conductivity. When the diameter of the crystalline silicon grains is greater than 10 nm, grain boundary surrounding the crystalline silicon grains has an excessively increased volume. Therefore, carrier recombination also increases and so the efficiency may decrease.

Meanwhile, as mentioned above, the hydrogen dilution ratio and pressure inside the chamber 310 are constant in the embodiments of the present invention. Since the flow rates of the hydrogen and silane supplied to the chamber 310 are greater than the flow rate of the non-silicon based source gas, controlling the flow rate of the hydrogen and the silane is relatively more difficult than that of the non-silicon based source gas, and the turbulence of hydrogen and silane can be generated in the chamber 310 due to the introduction of hydrogen and silane.

Therefore, when the flow rates of hydrogen and silane are constant, controlling of the non-silicon based source gas having a small flow rate is easy, and a possibility occurring of the turbulences of the hydrogen and silane in the chamber 310 is reduced, so that the film quality of the intermediate reflector 235 is improved.

Meanwhile, as described above, the plasma-enhanced chemical vapor deposition method is used instead of the photo-CVD in the embodiments of the present invention. Regarding the photo-CVD, not only it is not appropriate for manufacturing of the large area photovoltaic device, but also the UV light penetrating through a quartz window of the photo-CVD device decreases since a thin film is deposited on the quartz window as the deposition progresses. As a result, since the deposition rate thereof gradually decreases, the thicknesses of the first sub-layer 235a and second sub-layer 235b gradually decrease. On the other hand, such weaknesses of the photo-CVD may be overcome by the plasma-enhanced chemical vapor deposition method.

The frequency of the voltage supplied by the power source E in the plasma-enhanced chemical vapor deposition method used in the embodiment of the present invention may be greater than or equal to 13.56 MHz. When the frequency of the voltage supplied by the power source E is greater than or equal to 27.12 MHz, the deposition rate increases and the crystalline silicon grains can be easily formed.

In the embodiments of the present invention, the thickness of the intermediate reflector 235 may be greater than or equal to 30 nm and less than or equal to 200 nm. When the thickness of the intermediate reflector 235 is greater than or equal to 30 nm, the refractive index match between the unit cell closest to the light incident side and the intermediate reflector 235 is obtained and so the internal reflection can easily occur. When the thickness of the intermediate reflector 235 is less than or equal to 200 nm, the excessive light absorption by the intermediate reflector 235 itself caused by the thickness increase thereof is prevented. The thicknesses of the first sub-layer 235a and second sub-layer 235b may be greater than or equal to 10 nm and less than or equal to 50 nm. When the thicknesses of the first sub-layer 235a and second sub-layer 235b are greater than or equal to 10 nm, the refractive index match occurs and the crystalline silicon grains can be sufficiently formed.

Further, when the thickness of the first sub-layer 235a or the second sub-layer 235b is greater than 50 nm, the number of sub-layers included in the intermediate reflector 235 may decrease due to the large thickness. As a result, the internal reflection by the intermediate reflector 235 may be decreased. Therefore, when the thicknesses of the first sub-layer 235a and second sub-layer 235b are less than or equal to 50 nm, the appropriate number of sub-layers may be included in the intermediate reflector 235 and so the light can be easily reflected.

As mentioned above, the number of sub-layers included in the intermediate reflector 235 can be greater than or equal to three in that the thickness of the intermediate reflector 235 is greater than or equal to 30 nm and less than or equal to 200 nm, and the thicknesses of the first sub-layer 235a and second sub-layer 235b are greater than or equal to 10 nm and less than or equal to 50 nm.

Meanwhile, the refractive index of the intermediate reflector 235 including the first sub-layer 235a and second sub-layer 235b may be greater than or equal to 1.7 and less than or equal to 2.2. When the refractive index of the intermediate reflector 235 is greater than or equal to 1.7, the vertical electrical conductivity of the intermediate reflector 235 is increased and so a fill factor (FF) of a multiple junction photovoltaic device is improved. As a result, the efficiency is increased. When the refractive index of the intermediate reflector 235 is less than or equal to 2.2, light of a wavelength from 500 nm to 700 nm is easily reflected and the short circuit current of the first unit cell 230 increases. As a result, the efficiency is increased.

The average content of the non-silicon based element contained in the intermediate reflector 235 from the non-silicon based source gas may be greater than or equal to 10 atomic % and less than or equal to 30 atomic %. In the embodiment of the present invention, the non-silicon based source gas may be oxygen, carbon, or nitrogen. When the average content of the non-silicon based element is greater than or equal to 10 atomic %, the refractive index match between the unit cell closest to the light incident side and the intermediate reflector 235 is achieved and the internal reflection can easily occur.

Further, when the average content of the non-silicon based element is unnecessarily large, the vertical electrical conductivity of the sub-layers may decrease since the crystal volume fraction thereof decreases. Therefore, in the embodiment of the present invention, when the average content of the non-silicon based element is less than or equal to 30 atomic %, the electrical conductivity is improved since the average crystal volume fraction of the intermediate reflector 235 is appropriately maintained and it prevents the intermediate reflector 235 from getting amorphous.

The average hydrogen content of the intermediate reflector 235 may be greater than or equal to 10 atomic % and less than or equal to 25 atomic %. When the average hydrogen content of the intermediate reflector 235 is greater than or equal to 10 atomic %, the film quality of the intermediate reflector 235 is improved since the dangling bonds are passivated. When the average hydrogen content of intermediate reflector 235 is unnecessarily large, the electrical conductivity of the intermediate reflector 235 decreases since the crystal volume fraction thereof becomes small. Therefore, when the average hydrogen content of the intermediate reflector 235 is less than or equal to 25 atomic %, the vertical electrical conductivity increases since it prevents the intermediate reflector 235 from getting amorphous caused by the decrease of the crystal volume fraction.

The average crystal volume fraction of the intermediate reflector 235 may be greater than or equal to 4% and less than or equal to 30%. When the average crystal volume fraction of the intermediate reflector 235 is greater than or equal to 4%, the tunnel junction property improves, and when the average crystal volume fraction of the intermediate reflector 235 is less than 30%, degradation of the refractive index matching property is prevented since the content of the non-silicon based material is maintained.

Since the intermediate reflector 235 according to the embodiment of the present invention includes an n-type nano-crystalline silicon having a good vertical electrical conductivity, it may be substituted for an n-type semiconductor layer of the unit cell of the side from which light is incident. For example, the photovoltaic device according to the embodiment of the present invention includes a first unit cell including a p-type semiconductor layer and intrinsic semiconductor layer, the intermediate reflector 235, and a second unit cell including a p-type semiconductor layer, intrinsic semiconductor layer and n-type semiconductor layer. When the intermediate reflector 235 is substituted for the n-type semiconductor layer of the unit cell of the side from which light is incident, it can reduce the manufacturing time and cost of the photovoltaic device.

In the case of the p-i-n type photovoltaic device on which light is incident through the first unit cell 230, the intermediate reflector 235 may replace the n-type semiconductor layer of the first unit cell 230. Regarding the n-i-p type photovoltaic device on which light is incident through the second unit cell 240, the intermediate reflector 235 may replace the n-type semiconductor layer of the second unit cell 240.

Meanwhile, as shown in FIGS. 4 to 6, the first flow rate value α and second flow rate value β may increase in accordance with the elapsed deposition time, or the duration time t1 of the first flow rate value α and the duration time t2 of the second flow rate value β may increase in accordance with the elapsed deposition time T. As a result, the intermediate reflector 235 includes a plurality of first sub-layers 235a and second sub-layers 235b alternately stacked. With respect to any two first sub-layers of the first sub-layers 235a, one first sub-layer formed prior to the other first sub-layer has smaller amount of the non-silicon based material than that of the other first sub-layer formed posterior to the one first sub-layer. The second sub-layers 235b are the same as the described first sub-layers 235a. That is, it is profiled such that the concentrations of the non-silicon based element such as oxygen, carbon, or nitrogen contained in the first sub-layers 235a and second sub-layers 235b respectively increases more the farther it is from the light incident side.

When the concentration of the non-silicon element contained in the first sub-layers 235a and second sub-layers 235b increases farther from the light incident side, the components may gradually change at the interface between one unit cell and intermediate reflector 235.

Although the p-i-n type photovoltaic device on which light is incident in the direction from the first unit cell 230 formed on the substrate 100 to the second unit cell 240 has been described in the embodiment of the present invention, the present invention may be applied to an n-i-p type photovoltaic device on which light is incident from the opposite side to the substrate 100, that is, in the direction from the second unit cell 240 to the first unit cell 230.

Figure 8:
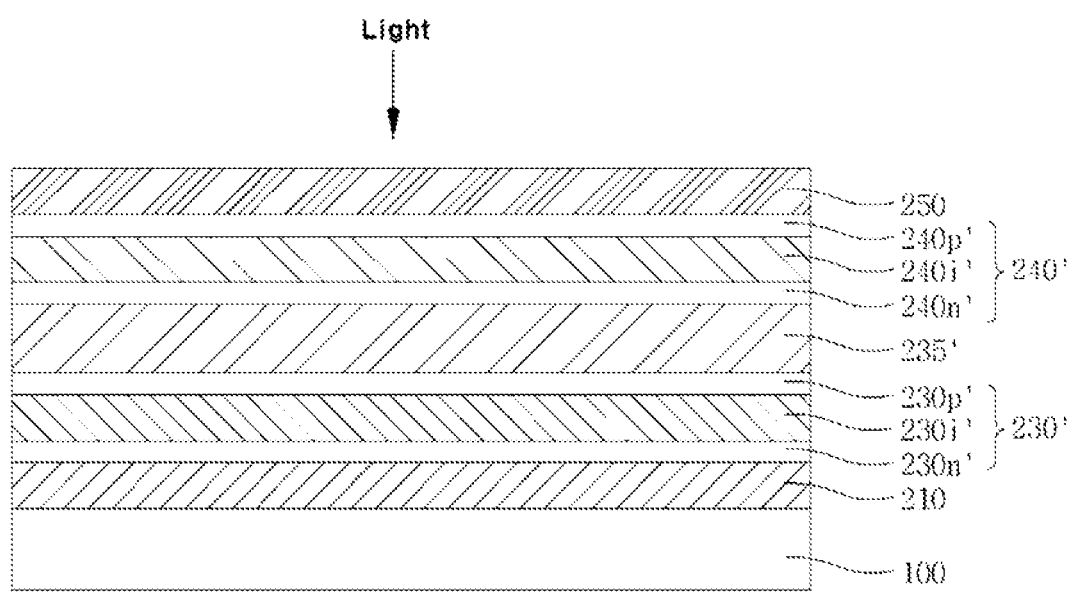
FIG. 8 shows a photovoltaic device according to another embodiment of the present invention.

In other words, as shown in FIG. 8, regarding the n-i-p type photovoltaic device, light is incident from the opposite side to the substrate 100, and the first unit cell 230' having an n-type semiconductor layer 230n', intrinsic semiconductor layer 230i' and p-type semiconductor layer 230p' sequentially stacked therein is formed on the first electrode 210. The intermediate reflector 235' is formed on the first unit cell 230'. The second unit cell 240' having an n-type semiconductor layer 240n', intrinsic semiconductor layer 240i' and p-type semiconductor layer 240p' sequentially stacked therein is formed on the intermediate reflector 235'. The second electrode 250 is formed on the second unit cell 240'.

The intermediate reflector 235' is required to form a refractive index matching with the second unit cell 240' of the side from which light is incident, and the intermediate reflector 235' contacts with the n-type semiconductor layer of the second unit cell 240'. Therefore, after forming the p-type semiconductor layer of the first unit cell 230', the intermediate reflector 235' including n-type nano-crystalline silicon material is formed. Here, the intermediate reflector 235' includes a plurality of sub-layers along with the flow rate change of the non-silicon based source gas. Like the embodiments of the present invention shown in FIGS. 4 to 6, the sub-layers of the intermediate reflector 235' according to another embodiment of the present invention may also be profiled such that the concentration of the non-silicon element gradually changes.

However, in the embodiments of the present invention shown in FIGS. 4 to 6, the first flow rate value α and second flow rate value β gradually increase or the duration time of the first flow rate value α and the duration time of the second flow rate value β gradually increase in accordance with the elapsed deposition time T. This prevents the abrupt components change between the n-type semiconductor layer of the first unit cell 230 closest to the light incident side and the intermediate reflector 235.

In the photovoltaic device according to another embodiment of the present invention, light is incident through the second unit cell 240'. Therefore, in order to prevent the abrupt components change between the n-type semiconductor layer of the second unit cell 240' of the side from which light is incident and the intermediate reflector 235, the first flow rate value α and second flow rate value β gradually decrease or the duration time of the first flow rate value α and the duration time of the second flow rate value β gradually decrease in accordance with the elapsed deposition time T. That is, in the embodiments of the present invention, the sub-layers of the intermediate reflector 235 and 235' are profiled such that the concentrations of the non-silicon element included in the sub-layers respectively increase more the farther it is from the light incident side.

Figure 9:
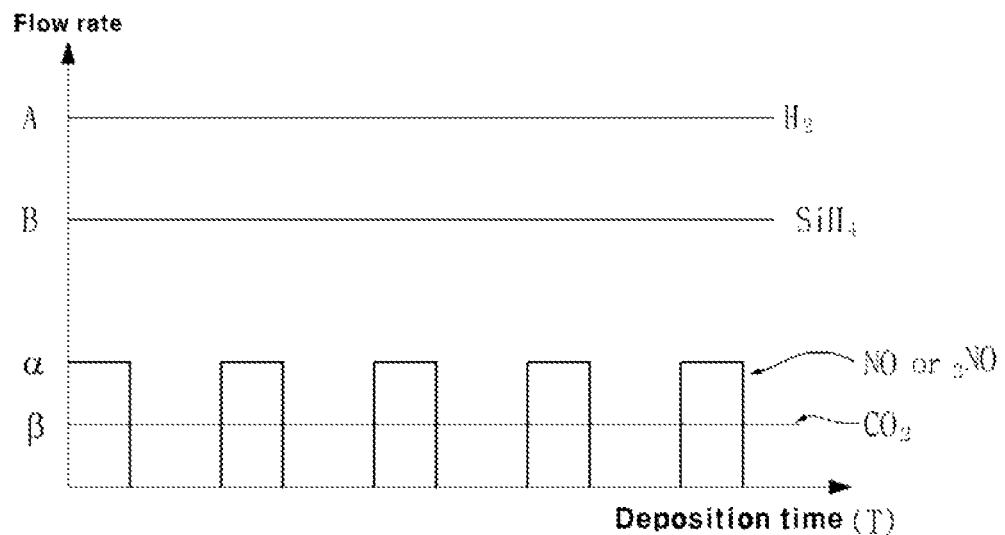
FIG. 9 and FIG. 10 show another flow rate change of non-silicon based source gas for forming an intermediate reflector according to the embodiment of the present invention.
Figure 10:
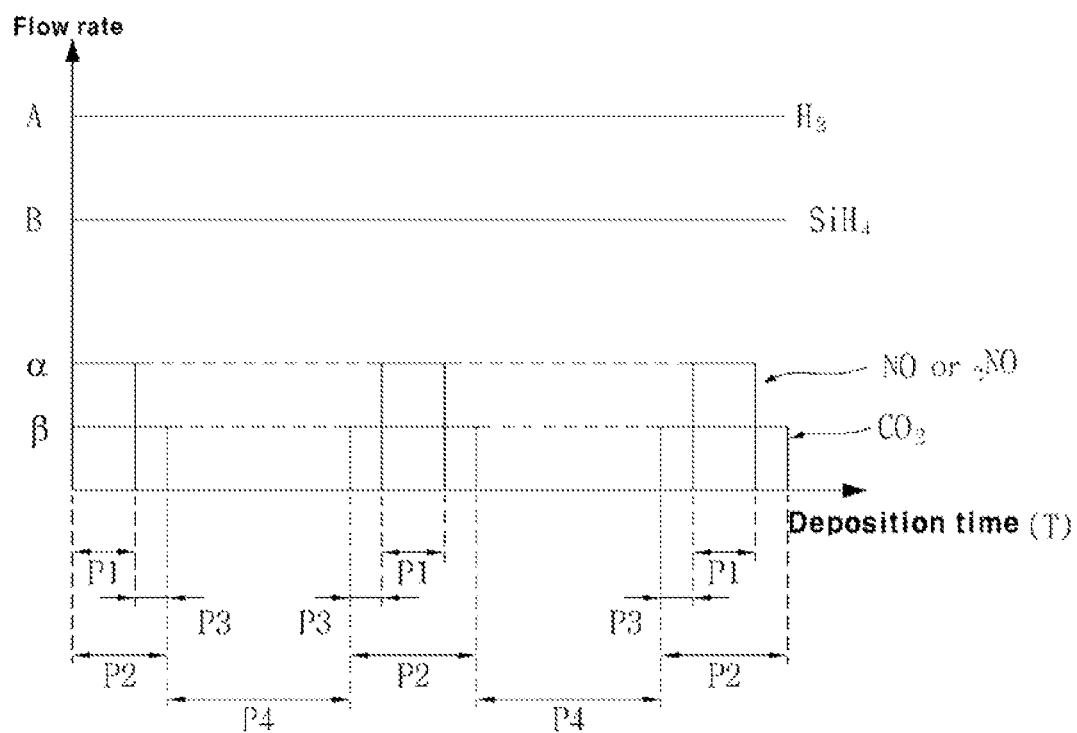

FIG. 9 and FIG. 10 show the flow rate change of another non-silicon based source gas in order to form the intermediate reflector according to the embodiment of the present invention.

As shown in FIG. 9, the flow rate A of hydrogen, the flow rate B of silane, and the flow rate (not shown) of phosphine ($PH_3$) are constant. Here, the flow rate of a first non-silicon based source gas such as NO or $NO_2$ alternately varies between a first flow rate value α and the flow rate of zero, and the flow rate of a second non-silicon based source gas such as carbon dioxide may be constant with a second flow rate value β which is less than the first flow rate α. As a result, the first sub-layer 235 including a hydrogenated n-type nano-crystalline silicon oxynitride (n-nc-SiON:H) including both oxygen and nitrogen is formed, while the first non-silicon based source gas such as NO or $NO_2$ is supplied with the first flow rate value α.

While the supply of the second non-silicon based source gas such as NO or $NO_2$ is cut off as the flow rate is zero and the second non-silicon based source gas such as carbon dioxide is supplied at the second flow rate value β, the second sub-layer 235b including crystalline silicon grains and a hydrogenated n-type nano-crystalline silicon oxide (n-nc-SiO:H) surrounding the crystalline silicon grains is formed. The intermediate reflector 235 including the above first sub-layer 235a and second sub-layer 235b forms a refractive index matching with the unit cell of the side from which light is incident due to the non-silicon based source gas, and it improves the vertical electrical conductivity among unit cells by the crystalline silicon grains. Since the second sub-layer 235b includes the crystalline silicon grains, it has a lager crystal volume fraction than that of the first sub-layer 235a.

Meanwhile, as shown in FIG. 10, the flow rate A of hydrogen, the flow rate B of silane, and the flow rate (not shown) of phosphine ($PH_3$) are constant. It is repeated to supply and stop supplying the second non-silicon based source gas such as carbon dioxide with a second flow rate value β. And it is also repeated to supply and stop supplying the first non-silicon based source gas such as NO or $NO_2$ with a first flow rate value α which is greater than the second flow rate β only while supplying the second non-silicon based source gas.

As a result, the first sub-layer 235a including a hydrogenated n-type nano-crystalline silicon oxynitride (n-nc-SiON:H) is formed during the period P1 that the first non-silicon based source gas and second non-silicon based source gas are supplied. During the period P3 that the second non-silicon based source gas is supplied, the second sub-layer 235b including a hydrogenated n-type nano-crystalline silicon oxide (n-nc-SiO:H) is formed. And during the period P4 that the supply of the first non-silicon based source gas and second non-silicon based source gas is cut off, the third sub-layer including a hydrogenated n-type nano-crystalline silicon (n-nc-Si:H) is formed. Here, the size of the crystalline silicon grains may increase as the flow rate of the non-silicon based source gas decreases. Therefore, the size of the crystalline silicon grains of the third sub-layer may be greater than the size of the crystalline silicon grains of the second sub-layer 235b. As a result, the crystal volume fraction of the third sub-layer is the largest and the crystal volume fraction of the first sub-layer 235a is the smallest.

As such, the intermediate reflector 235 composed of the three sub-layers having different refractive indexes from each other can easily form the refractive index match with the unit cell of the side from which light is incident and improve the vertical electrical conductivity among unit cells.

In the FIG. 10, the first flow rate value α is shown greater than the second flow rate value β, but the first flow rate value α may be less than the second flow rate value β. Although the first flow rate value α is less than the second flow rate value β, first non-silicon based source gas and second non-silicon based source gas are simultaneously supplied during the period P1, the first non-silicon based source gas is cut off and the second non-silicon based source gas is supplied during the period P3, and the first non-silicon based source gas and second non-silicon based source gas are simultaneously cut off during the period P4. Since the flow rate of all the non-silicon based source gas supplied during the period P1 is greater than the flow rate of all the non-silicon based source gas supplied during the period P3, the crystal volume fraction of the third sub-layer is the largest and the crystal volume fraction of the first sub-layer is the smallest.

Meanwhile, the photovoltaic device according to the embodiments of the present invention includes the intermediate reflector 235' so as to improve the efficiency of a tandem structure including a plurality of unit cells. It is possible to provide even better efficiency by controlling the electric currents of the plurality of the unit cells in addition to introducing the intermediate reflector 235'.

In general, the operating temperature of the photovoltaic device is an important factor in designing current matching among the plurality of the unit cells of the photovoltaic device having a tandem structure. For example, a photovoltaic device installed in a region having high temperature or strong ultraviolet radiation is designed such that short circuit current of the photovoltaic device is determined by the short circuit current of the unit cell which is closest to the light incident side among the unit cells of the photovoltaic device. This is because the photovoltaic device having its short circuit current determined by the short circuit current of the unit cell which is closest to the light incident side has low temperature coefficient (i.e., an efficiency degradation rate of the photovoltaic device according to temperature rise by 1° C.). That is, the temperature rise of the photovoltaic device has small influence on the efficiency degradation thereof.

On the other hand, a photovoltaic device installed in a region having low temperature or small amount of ultraviolet radiation is designed such that short circuit current of the photovoltaic device is determined by the short circuit current of the unit cell which is farthest from the light incident side among the unit cells of the photovoltaic device. Even though the photovoltaic device having its short circuit current determined by the short circuit current of the unit cell which is farthest from the light incident side has high temperature coefficient (i.e., an efficiency degradation rate of the photovoltaic device according to a temperature rise by 1° C.), it has low degradation ratio. Since the photovoltaic device installed in a low temperature region is relatively less affected by the temperature coefficient, the photovoltaic device is designed such that the short circuit current of the photovoltaic device is determined by the short circuit current of the unit cell which is farthest from the light incident side.

A rated output (efficiency) of the photovoltaic device designed in this manner is measured indoors under standard test conditions (hereinafter, referred to as STC). The set of STC consists of the followings.

AM 1.5 (AIR MASS 1.5)
Irradiance: $1000 \text{ W} \cdot \text{m}^{-2}$
Photovoltaic cell Temperature: 25° C.

However, when a photovoltaic device is installed outdoors, it happens that the temperature of the photovoltaic device is higher than 25° C. In this case, due to the temperature coefficient of the photovoltaic device, the efficiency of the photovoltaic device becomes lower than the rated efficiency of the photovoltaic device measured under the STC. That is, when the photovoltaic device is operating, most of light energy absorbed by the photovoltaic device is converted into heat energy. An actual operating temperature of the photovoltaic device hereby easily becomes higher than 25° C., i.e., the photovoltaic cell temperature under the STC. Accordingly, the temperature coefficient of the photovoltaic device causes the efficiency of the photovoltaic device to be lower than the rated efficiency of the photovoltaic device measured under the STC.

Because of such problems, when current matching design in the photovoltaic device having a tandem structure is performed on the basis of 25° C., i.e., the temperature of the photovoltaic device according to the STC without considering the actual operating temperature thereof in the external environment, the photovoltaic device may not achieve a desired efficiency.

Accordingly, current matching design of the photovoltaic device according to the embodiment of the present invention is performed under a nominal operating cell temperature obtained in a standard reference environment which is similar to the actual condition under which the photovoltaic device is installed. The set of standard reference environment includes the followings.

Tilt angle of photovoltaic device: 45° from the horizon
Total irradiance: 800 W·m$^{-2}$
Circumstance temperature: 20° C.
Wind speed: 1 m·s$^{-1}$
Electric load: none (open state)

The nominal operating cell temperature corresponds to a temperature at which the photovoltaic device mounted on an open rack operates under the standard reference environment. The photovoltaic device is used in a variety of actual environments. Therefore, when designing the current matching of the photovoltaic device having a tandem structure is performed under nominal operating cell temperature measured in the standard reference environment which is similar to the condition under the photovoltaic device is actually installed, it is possible to manufacture the photovoltaic device suitable for the actual installation environment. By controlling the thicknesses and optical band gaps of the i-type photoelectric conversion layers of the first unit cell 230' and second unit cell 240' such that the short circuit currents of the first unit cell 230' and second unit cell 240' are controlled, the efficiency of the photovoltaic device may be enhanced.

For this reason, in the embodiment of the present invention, when the nominal operating cell temperature of the photovoltaic device is equal to or more than 35 degrees Celsius, the thickness and optical band gap of the i-type photoelectric conversion layer of one unit cell which is closest to the light incident side between the first unit cell 230' and second unit cell 240' is set such that the short circuit current of the one unit cell is equal to or less than that of the other unit cell. As a result, the short circuit current of the photovoltaic device according to the embodiment of the present invention is determined by the short circuit current of the unit cell which is closest to the light incident side.

As such, when the short circuit current of one unit cell which is closest to the light incident side is equal to or less than that of the other unit cell, the temperature coefficient becomes smaller. Therefore, although the actual temperature of the photovoltaic device becomes higher, electricity generation performance decrease due to the efficiency degradation is reduced. For example, when the photovoltaic device designed for making the short circuit current of one unit cell which is closest to the light incident side to be equal to or less than the short circuit current of the other unit cell is installed in a region having high temperature or strong ultraviolet rays of sunlight including intensive short wavelength rays in a blue-color range, the temperature coefficient is small. Therefore, although the actual temperature of the photovoltaic device becomes higher, the electricity generation performance decrease due to the efficiency degradation is reduced.

Contrary to this, when the nominal operating cell temperature of the photovoltaic device is less than and not equal to 35 degrees Celsius, the thicknesses and optical band gap-of the i-type photoelectric conversion layer of one unit cell which is farthest from the light incident side between the first unit cell 230' and second unit cell 240' is set such that the short circuit current of the other unit cell which is closest to the light incident side is equal to or less than that of the one unit cell. In other words, when the nominal operating cell temperature of the photovoltaic device is less than and not equal to 35 degrees Celsius, the thickness and optical band gap of the i-type photoelectric conversion layer of one unit cell which is closest to the light incident side between the first unit cell 230' and second unit cell 240' is determined such that the short circuit current of the other unit cell is equal to or more than that of the one unit cell.

A resulting short circuit current of the photovoltaic device according to the embodiment of the present invention is hereby determined by the short circuit current of the unit cell which is farthest from the light incident side between the first unit cell and second unit cell. In this case, even though temperature coefficient of the photovoltaic device is high, degradation ratio of the photovoltaic device is reduced. Since the actual operating temperature of the photovoltaic device is relatively low, the electricity generation performance may be improved in that the performance improvement due to the low degradation ratio may overtake the performance deterioration due to the high temperature coefficient. Particularly, because the degradation rate in fill factor is small, the photovoltaic device has an excellent outdoor electricity generation performance in an environment having a circumference temperature lower than 25° C., i.e., the STC.

As described in the embodiment, regarding the photovoltaic device of which current matching design is performed under the nominal operating cell temperature, the short circuit current of the photovoltaic device can be measured under the STC.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A photovoltaic device comprising:
a substrate;
a first electrode placed on the substrate;
a first unit cell placed on the first electrode and comprising an intrinsic semiconductor layer;

an intermediate reflector placed on the first unit cell and comprising a plurality of sub-layers stacked alternately, and the plurality of sub-layers having different crystal volume fractions from each other;

a second unit cell placed on the intermediate reflector and comprising an intrinsic semiconductor layer; and a second electrode placed on the second unit cell.

2. The photovoltaic device according to claim 1, wherein the intermediate reflector is profiled such that concentrations of a non-silicon based element included in the sub-layers increase the farther the concentrations of the non-silicon based element are from a light incident side of the photovoltaic device.

3. The photovoltaic device according to claim 1, wherein the intermediate reflector includes a hydrogenated n-type nano-crystalline silicon oxide, a hydrogenated n-type nano-crystalline silicon carbide, or a hydrogenated n-type nano-crystalline silicon nitride.

4. The photovoltaic device according to claim 1, wherein the unit cell which is closest to a light incident side of the photovoltaic device comprises an n-type semiconductor layer including a hydrogenated n-type nano-crystalline silicon, and the intermediate reflector in contact with the n-type semiconductor layer includes an n-type nano-crystalline silicon based material.

5. The photovoltaic device according to claim 1, wherein the plurality of sub-layers comprise at least one pair of a first sub-layer and a second sub-layer, and wherein a thickness ratio between the first sub-layer and the second sub-layer in each of the pairs is constant.

6. The photovoltaic device according to claim 1, wherein the plurality of sub-layers comprise a first sub-layer and a second sub-layer, and wherein one of either the first sub-layer or second sub-layer has a larger crystal volume fraction comprising crystalline silicon grains than the other sub-layer.

7. The photovoltaic device according to claim 1, wherein the plurality of sub-layers comprise a first sub-layer and a second sub-layer, and wherein one of either the first sub-layer or the second sub-layer has a greater crystal volume fraction than the other sub-layer.

8. The photovoltaic device according to claim 1, wherein the plurality of sub-layers comprise a first sub-layer and a second sub-layer, and wherein one of either the first sub-layer or second sub-layer has a larger crystal volume fraction comprising crystalline silicon grains, and wherein a diameter of the crystalline silicon grains is greater than or equal to 3 nm and less than or equal to 10 nm.

9. The photovoltaic device according to claim 1, wherein a thickness of the intermediate reflector is greater than or equal to 30 nm and less than or equal to 200 nm.

10. The photovoltaic device according to claim 1, wherein the plurality of sub-layers comprise a first sub-layer and a second sub-layer, and thicknesses of the first sub-layer and the second layer are greater than or equal to 10 nm and less than or equal to 50 nm.

11. The photovoltaic device according to claim 1, wherein the number of the sub-layers included in the intermediate reflector is greater than or equal to three.

12. The photovoltaic device according to claim 1, wherein a refractive index of the intermediate reflector is greater than or equal to 1.7 and less than or equal to 2.2 in a wavelength range from 500 nm to 700 nm.

13. The photovoltaic device according to claim 1, wherein an average content of a non-silicon based element included in the intermediate reflector is greater than or equal to 10 atomic % and less than or equal to 30 atomic %.

14. The photovoltaic device according to claim 1, wherein an average hydrogen content of the intermediate reflector is greater than or equal to 10 atomic % and less than or equal to 25 atomic %.

15. The photovoltaic device according to claim 1, wherein an average crystal volume fraction of the intermediate reflector is greater than or equal to 4% and less than or equal to 30%.

16. The photovoltaic device according to claim 1, wherein the unit cell which is closest to a light incident side of the photovoltaic device comprises a p-type semiconductor layer and an intrinsic semiconductor layer, and the intermediate reflector contacts with the intrinsic semiconductor layer of the unit cell which is closest to the light incident side of the photovoltaic device.

17. The photovoltaic device according to claim 1, wherein, when a nominal operating cell temperature of the photovoltaic device is greater than or equal to 35 degrees Celsius, and a short circuit current of the unit cell that is closest to a light incident side of the photovoltaic device, is less than or equal to that of the other unit cell.

18. The photovoltaic device according to claim 1, wherein, when nominal operating cell temperature of the photovoltaic device is less than 35 degrees Celsius, and a short circuit current of one unit cell, which is closest to a light incident side of the photovoltaic device, is greater than or equal to that of the other unit cell.

19. The photovoltaic device according to claim 1, wherein the plurality of sub-layers comprise a first sub-layer and a second sub-layer, and one of either the first sub-layer or the second sub-layer comprises a hydrogenated n-type nano-crystalline silicon oxynitride (n-nc-SiON:H), and the other comprises a hydrogenated n-type nano-crystalline silicon oxide (n-nc-SiO:H).

20. The photovoltaic device according to claim 1, wherein the plurality of sub-layers comprises a first sub-layer, a second sub-layer, and a third sub-layer.

21. The photovoltaic device according to claim 20, wherein the first sub-layer includes a hydrogenated n-type nano-crystalline silicon oxynitride (n-nc-SiON:H), the second sub-layer includes a hydrogenated n-type nano-crystalline silicon oxide (n-nc-SiO:H), and the third sub-layer includes a hydrogenated n-type nano-crystalline silicon (n-nc-Si:H).

22. A photovoltaic device comprising:
a substrate;
a first electrode placed on the substrate;
a first unit cell placed on the first electrode and comprising an intrinsic semiconductor layer;
an intermediate reflector placed on the first unit cell and comprising a plurality of sub-layers stacked alternately, and the plurality of sub-layers having different crystal volume fractions from each other;
a second unit cell placed on the intermediate reflector and comprising an intrinsic semiconductor layer; and
a second electrode placed on the second unit cell,
wherein the plurality of sub-layers stacked alternately comprise a first layer formed at a first flow rate $\alpha$ of a non-silicon based source gas and a second layer formed at a second flow rate $\beta$ of the non-silicon based source gas, wherein the first flow rate $\alpha$ is greater than the second flow rate $\beta$, and the first layer is disposed between the first unit cell and the second layer.

* * * * *